United States Patent
Arnold et al.

(10) Patent No.: US 9,293,382 B2
(45) Date of Patent: Mar. 22, 2016

(54) VOLTAGE CONTRAST INSPECTION OF DEEP TRENCH ISOLATION

(71) Applicant: GLOBALFOUNDRIES INC., Grand Cayman (KY)

(72) Inventors: Norbert Arnold, Hopewell Junction, NY (US); Jin Liu, Chappaqua, NY (US); Brian W. Messenger, Newburgh, NY (US); Oliver D. Patterson, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/522,626

(22) Filed: Oct. 24, 2014

(65) Prior Publication Data
US 2015/0041809 A1    Feb. 12, 2015

Related U.S. Application Data

(62) Division of application No. 13/686,954, filed on Nov. 28, 2012, now Pat. No. 8,927,989.

(51) Int. Cl.
| | |
|---|---|
| *H01L 23/58* | (2006.01) |
| *H01L 27/12* | (2006.01) |
| *G01R 31/26* | (2014.01) |
| *H01L 21/20* | (2006.01) |
| *H01L 21/66* | (2006.01) |
| *H01L 49/02* | (2006.01) |

(Continued)

(52) U.S. Cl.
CPC .............. *H01L 22/14* (2013.01); *H01L 21/762* (2013.01); *H01L 21/84* (2013.01); *H01L 22/32* (2013.01); *H01L 22/34* (2013.01); *H01L 27/10861* (2013.01); *H01L 27/10894* (2013.01); *H01L 27/1203* (2013.01); *H01L 28/40* (2013.01); *H01L 28/60* (2013.01); *H01L 29/66181* (2013.01)

(58) Field of Classification Search
CPC ......... H01L 22/14; H01L 22/32; H01L 22/34; H01L 21/762; H01L 27/10861; H01L 27/1203; H01L 29/66181; H01L 27/10894
USPC ........................................ 257/48, 348; 438/18
See application file for complete search history.

(56) References Cited

U.S. PATENT DOCUMENTS

| | | | |
|---|---|---|---|
| 6,339,228 | B1 | 1/2002 | Iyer et al. |
| 7,122,437 | B2 | 10/2006 | Dyer et al. |

(Continued)

OTHER PUBLICATIONS

Doemling et al., "Observation of inverse reactive ion etching lag for silicon dioxide etching in inductively coupled plasmas", Apply. Phys. Lett vol. 68 No. 1, pp. 10-12, Jan. 1, 1996.

(Continued)

*Primary Examiner* — Long K Tran
*Assistant Examiner* — Dzung Tran
(74) *Attorney, Agent, or Firm* — Scully, Scott, Murphy & Presser, P.C.

(57) ABSTRACT

A method including forming a first test structure and a second test structure in electrical contact with an inner buried plate and an outer buried plate, respectively, where the first and second test structures each comprise a deep trench filled with a conductive material, and measuring the voltage of the inner buried plate and the outer buried plate immediately after the formation of a deep trench isolation structure, where the inner buried plate and the outer buried plate are positioned on opposite sides of the deep trench isolation structure.

5 Claims, 7 Drawing Sheets

(51) Int. Cl.
*H01L 21/84* (2006.01)
*H01L 29/66* (2006.01)
*H01L 27/108* (2006.01)
*H01L 21/762* (2006.01)

(56) References Cited

U.S. PATENT DOCUMENTS

| | | |
|---|---|---|
| 7,679,130 B2 | 3/2010 | Tilke et al. |
| 7,786,017 B1 | 8/2010 | Morgenfeld et al. |
| 7,910,451 B2 | 3/2011 | Dyer |
| 8,021,941 B2 | 9/2011 | Chapman et al. |
| 2003/0022457 A1* | 1/2003 | Gutsche et al. ............... 438/386 |
| 2004/0056248 A1 | 3/2004 | Liu et al. |
| 2005/0085096 A1* | 4/2005 | Low et al. ..................... 438/778 |
| 2006/0202249 A1* | 9/2006 | Cheng et al. .................. 257/301 |
| 2007/0145489 A1* | 6/2007 | Yeh et al. ...................... 257/370 |
| 2010/0124806 A1* | 5/2010 | Lee ................................ 438/243 |

OTHER PUBLICATIONS

Chung et al., "Inverse RIE Lag of Silicon Deep Etching", NSTI-Nanotech 2004, pp. 481-484, vol. 1, 2004.

Jansen et al., "RIE Lag in High Aspect Ratio Trench Etching of Silicon", Microelectronic Engineering vol. 35, pp. 45-50, 1997.

U.S. Appl. No. 13/686,954, entitled: "Voltage Contrast Inspection of Deep Trench Isolation", filed Nov. 28, 2012.

* cited by examiner

VOLTAGE CONTRAST INSPECTION OF DEEP TRENCH ISOLATION

CROSS REFERENCE

The present application is a divisional of and claims priority under 35 U.S.C. §120 of U.S. patent application Ser. No. 13/686,954, filed on Nov. 28, 2012, which is incorporated by reference in its entirety.

BACKGROUND

The present invention generally relates to integrated circuits, and more particularly to testing the integrity of deep trench isolation structures.

Embedded dynamic random access memory (eDRAM) is a critical part of modern semiconductor technologies. This memory may require about one third the space of static random access memory (SRAM) because each bit only requires one transistor that accesses a capacitor. There exist multiple techniques by which to implement a capacitor in an eDRAM device. One way to build the capacitor may be to etch a deep trench in a semiconductor-on-insulator (SOI) substrate and then fill the deep trench with a node dielectric and an inner electrode. The structure may be known as a deep trench capacitor. In such a structure, a layer of conductive material below the buried dielectric layer of the SOI substrate forms a buried plate of the capacitor. The buried plate may also be referred to as a cathode, and may generally be doped silicon. The inner electrode formed within the deep trench is the top plate or anode of the capacitor. The buried plate and the top plate may generally be separated by the node dielectric.

The buried plate, or cathode, for all deep trench capacitors formed in a single SOI substrate may be electrically connected unless otherwise intentionally isolated. One method by which to isolate the buried plate of one deep trench capacitor from the buried plate of another deep trench capacitor may be to create an isolation device extending from a top surface of the SOI substrate to below the buried plate. In some cases the isolation device may completely surround one or more deep trench capacitors separating them from the rest of the chip. Such an isolation device may commonly be referred to as a deep trench moat (DTMoat).

It may be advantageous to test the integrity of the isolation device to ensure the reliability of the semiconductors devices relying on its electrical isolation properties.

SUMMARY

According to one embodiment of the present invention, a method is provided. The method may include forming a first test structure and a second test structure in electrical contact with an inner buried plate and an outer buried plate, respectively, where the first and second test structures each include a deep trench filled with a conductive material, and measuring the voltage of the inner buried plate and the outer buried plate immediately after the formation of a deep trench isolation structure, where the inner buried plate and the outer buried plate are positioned on opposite sides of the deep trench isolation structure.

According another exemplary embodiment, a method is provided. The method may include providing a semiconductor-on-insulator (SOI) substrate having a buried dielectric layer located above a buried plate, forming a deep trench isolation structure in the SOI substrate having a first node dielectric and a first inner electrode, where the deep trench isolation structure electrically isolates an inner buried plate located on one side of the deep trench isolation structure from an outer buried plate located on an opposite side of the deep trench isolation structure, and forming a deep trench capacitor in the SOI substrate having a second node dielectric and a second inner electrode. The method may further include forming a first test structure and a second test structure in the SOI substrate and on opposite sides of the deep trench isolation structure, the first and second test structures having a third node dielectric and a third inner electrode, where the first test structure and the second test structure are similar in size and shape, and have a different width than the deep trench capacitor, etching the third node dielectric and the third inner electrode of the first and second test structures to a first depth below the buried dielectric layer, etching the second node dielectric and the second inner electrode of the deep trench capacitor to a second depth above the buried plate and within the buried dielectric layer, and etching the first node dielectric and the first inner electrode to a third depth above the buried plate and within the buried dielectric layer, where the first depth is deeper than the second depth.

According another exemplary embodiment, a method is provided. The method may include a semiconductor-on-insulator (SOI) substrate having a buried dielectric layer located above a buried plate, a deep trench isolation structure extending into the SOI substrate having a first node dielectric and a first inner electrode, and being substantially filled with a first conductive material isolated from the buried plate, where the deep trench isolation structure electrically isolates an inner buried plate located on one side of the deep trench isolation structure from an outer buried plate located on an opposite side of the deep trench isolation trench structure, a deep trench capacitor extending into the SOI substrate having a second node dielectric and a second inner electrode, and being substantially filled with a second conductive material isolated from the buried plate, and a first test structure and a second test structure extending into the SOI substrate having a third node dielectric and a third inner electrode, and being substantially filled with a third conductive material, where the third conductive material of the first test structure is in electrical contact with the inner buried plate and the first conductive material of the second test structure is in electrical contact with the outer buried plate, and where the first test structure and the second test structure are similar in size and shape, and have a different width than the deep trench capacitor.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIGS. 2-9 illustrate the steps of a method of forming the semiconductor structure according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates to voltage contrast (VC) inspection, and more particularly, VC inspection used to test the functionality and integrity of a deep trench isolation structure. In a preferred embodiment, the VC inspection may be carried out on a structure in which voltage readings based on a voltage contrast signal from opposite sides of the deep trench isolation structure may be compared and contrasted. Comparison of these voltage measurements may yield a prediction as to whether the deep trench isolation structure is functioning properly, and preventing the flow of electrical current. Typically, VC inspection cannot be initiated until a device contact layer or a first metallization layer are formed. These layers were the only method by which to make electrical contact to the buried plate in order to conduct VC inspection. The following disclosure will discuss a structure and method by which to conduct VC inspection shortly after the isolation structure is formed. Testing the isolation structure earlier in the fabrication process may prevent unnecessary fabrication time and cost in the event the isolation structure fails the test. The detailed description below will first review the formation of the structure followed by a detailed description of the VC inspection procedure.

Figure 1:
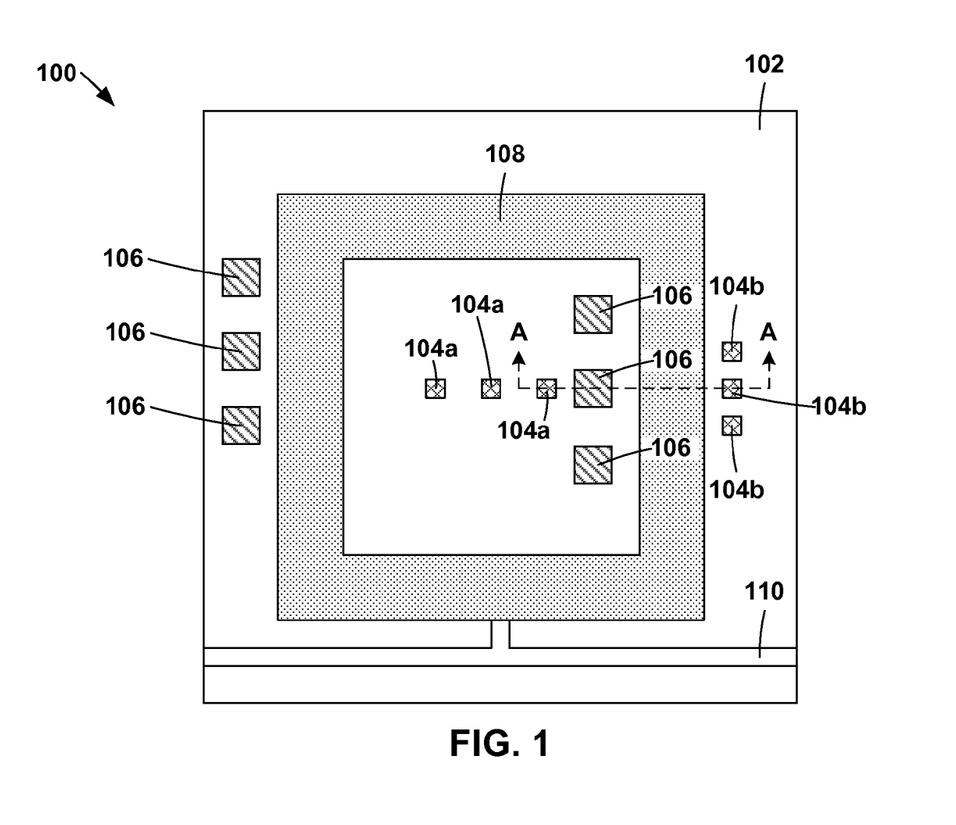
FIG. 1 depicts a top view of a semiconductor structure according to an exemplary embodiment.

Referring now to FIG. 1, a structure 100 is shown having a first plurality of test structures 104a, a second plurality of test structures 104b, a plurality of deep trench capacitors 106, a deep trench isolation structure 108 (DT isolation structure 108), and a ground structure 110 formed in a substrate 102. The first and second test structures 104a, 104b may be integrated into typical fabrication and process flows in order to conduct VC inspection testing. The VC inspection testing may be conducted to determine the integrity of the DT isolation structure 108. The DT isolation structure 108 may be designed to electrically isolate semiconductor devices formed on opposite sides of the DT isolation structure 108. In one embodiment, as depicted in the figure, the DT isolation structure 108 may include a deep trench isolation moat surrounding one or more semiconductor devices. In the present embodiment, the deep trench isolation moat may electrically isolate semiconductor devices inside the moat from semiconductor devices outside the moat.

The first and second test structures 104a, 104b may be constructed solely for the purpose of conducting the VC inspection testing. The deep trench capacitors 106 may be formed as components in a semiconductor device, for example, a deep trench capacitor used in an embedded DRAM memory cell. The first and second test structures 104a, 104b, the deep trench capacitors 106, and the DT isolation structure 108 may preferably be simultaneously formed during typical process flows without the need for additional steps. However, the first and second test structures 104a, 104b, the deep trench capacitors 106, and the DT isolation structure 108 may alternatively be formed by individual processes. The VC inspection testing sequence will be described in greater detail below, after a detailed description of forming the structure 100 is presented. It should be noted that only two test structures may be needed to conduct the VC inspection testing, however multiple test structures, for example the first and second test structures 104a, 104b, may be fabricated on both sides of the DT isolation structure 108 for redundancy purposes. Furthermore, the first and second test structures 104a, 104b, the deep trench capacitors 106, and the DT isolation structure 108 may be fabricated in any suitable configuration and location relative to one another, so long as, at least one test structure, for example the first test structure 104a, may be positioned on one side of the DT isolation structure 108 and at least one test structure, for example the second test structure 104b, may be positioned on an opposite side of the DT isolation structure 108.

Referring now to FIGS. 2-7, exemplary process steps of forming the structure 100 in accordance with one embodiment of the present invention are shown, and will now be described in greater detail below. It should be noted that FIGS. 2-7 all represent a cross section view, section A-A, of the structure 100 depicted in FIG. 1. It should also be noted that while this description may refer to some components of the structure 100 in the singular tense, more than one component may be depicted throughout the figures and like components are labeled with like numerals. For example, only two test structures 104a, 104b and one deep trench capacitor 106 are depicted in the following figures for illustrative purposes only. The process steps described below with reference to FIGS. 2-7 may apply to the entire structure 100 as depicted in FIG. 1.

Figure 2:
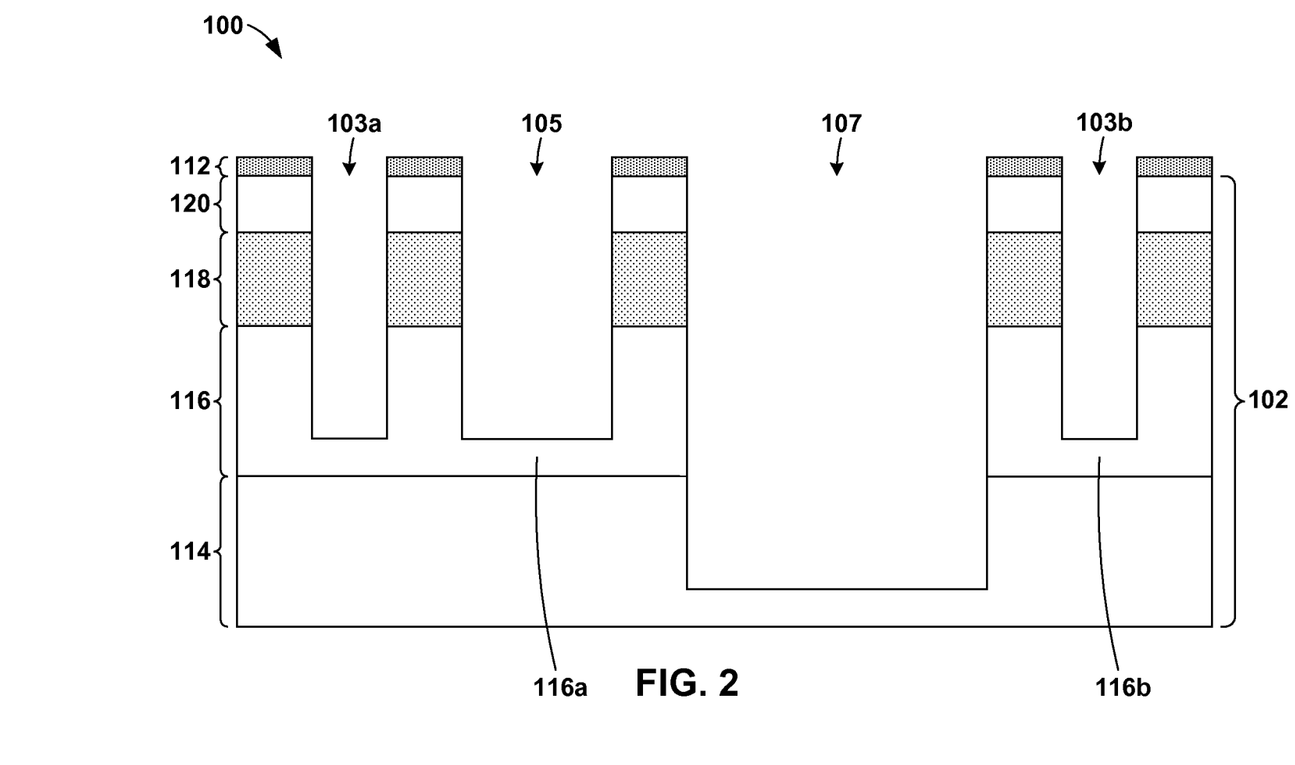
FIG. 2 depicts the formation of multiple deep trench structures according to an exemplary embodiment.

Referring now to FIG. 2, a cross section view, section A-A, of the structure 100 is shown at an intermediate step during the process flow. At this step of fabrication, and as described above, the structure 100 may include the first plurality of test structures 104a, the second plurality of test structures 104b, the plurality of deep trench capacitor 106, and the DT isolation structure 108; however, FIG. 2 depicts a cross section view including only two test structures 104a, 104b, a single deep trench capacitor 106, and the DT isolation structure 108.

Generally, the substrate 102 of the structure 100 may be a semiconductor-on-insulator (SOI) substrate. The SOI substrate employed in the present invention may include a base substrate 114, a buried plate 116 formed on top of the base substrate 114, a buried dielectric layer 118 formed on top of the buried plate 116, and a SOI layer 120 formed on top of the buried dielectric layer 118. The buried dielectric layer 118 may isolate the SOI layer 120 from the buried plate 116. Also, a pad layer 112 may be formed on top of the SOI layer 120.

The base substrate 114 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 114 may be about, but is not limited to, several hundred microns thick. For example, the base substrate 114 may include a thickness ranging from 0.5 mm to about 1.5 mm.

The buried plate 116 may be made from any suitable conductive material, for example, a doped semiconductor material. In one embodiment, the buried plate 116 may include any material listed above for the base substrate 114 that which may be doped with either p-type dopants or n-type dopants to induce conductive properties. In one embodiment, the buried plate 116 may have a vertical thickness ranging from about 5 nm to about 100 nm, and more typically from about 10 nm to about 50 nm, although lesser and greater thicknesses may be explicitly contemplated. In the present embodiment, the buried plate 116 may include an inner buried plate 116a and an outer buried plate 116b. The inner buried plate 116a may include a portion of the buried plate 116 located within the DT isolation structure 108, and the outer buried plate 116b may include a portion of the buried plate 116 located outside the DT isolation structure 108.

The buried dielectric layer 118 may be formed from any of several known dielectric materials. Non-limiting examples include, for example, oxides, nitrides and oxynitrides of silicon. Oxides, nitrides and oxynitrides of other elements are also envisioned. In addition, the buried dielectric layer 118 may include crystalline or non-crystalline dielectric material. Moreover, the buried dielectric layer 118 may be formed using any of several known methods. Non-limiting examples include ion implantation methods, thermal or plasma oxidation or nitridation methods, chemical vapor deposition methods and physical vapor deposition methods. In one embodiment, the buried dielectric layer 118 may be about 150 nm thick. Alternatively, the buried dielectric layer 118 may include a thickness ranging from about 10 nm to about 500 nm.

The SOI layer 120 may include any of the several semiconductor materials included in the base substrate 114. In general, the base substrate 114 and the SOI layer 120 may include either identical or different semiconducting materials with respect to chemical composition, dopant concentration and crystallographic orientation. In one particular embodiment of the present invention, the base substrate 114 and the SOI layer 120 may include semiconducting materials that include at least different crystallographic orientations. Typically the base substrate 114 or the SOI layer 120 may include a {110} crystallographic orientation and the other of the base substrate 114 or the SOI layer 120 may include a {100} crystallographic orientation. Typically, the SOI layer 120 may include a thickness ranging from about 5 nm to about 100 nm. Methods for forming the SOI layer 120 are well known in the art. Non-limiting examples include SIMOX (Separation by Implantation of Oxygen), wafer bonding, and ELTRAN® (Epitaxial Layer TRANsfer).

The pad layer 112 may include an insulating material such as, for example, silicon nitride. The pad layer 112 may be formed using conventional deposition methods, for example, low-pressure chemical vapor deposition (LPCVD). The pad layer 112 may have a thickness ranging from about 10 nm to about 500 nm. In one particular embodiment, the pad layer 112 may be about 100 nm thick. Optionally, a thin (2 nm to 10 nm, preferably 5 nm) thermal oxide layer (not shown) may be formed on the SOI layer 120 prior to forming the pad layer 112. Typically, the pad layer 112 may be used to protect the substrate 102 during subsequent processing operations.

With continued reference to FIG. 2, a location may be identified and a mask layer (not shown) of a suitable masking material may be deposited on the pad layer 112 and patterned using a conventional photolithographic techniques. The mask layer may include any suitable masking material such as photoresist or hardmask, for example, silicon dioxide. A first opening 103a and a second opening 103b may be formed by etching into the substrate 102 as illustrated by the figure. The first and second openings 103a, 103b can be formed using, for example, an anisotropic dry etch technique, such as reactive ion etching (RIE). The mask layer may be removed after the first and second openings 103a, 103b is formed, or alternatively, in a later process. A similar etching technique as described above may subsequently be used to form a third opening 105 and a fourth opening 107. It should be noted that the first and second openings 103a, 103b may be further processed to subsequently form the test structures 104a, 104b, the third opening 105 may be further processed to subsequently form the deep trench capacitor 106, and the fourth opening 107 may be further processed to subsequently form the DT isolation structure 108.

Each of the openings 103a, 103b, 105, 107 may have a different size, shape, and depth, while noting that the first and second openings 103a, 103b being substantially similar. Generally, the first and second openings 103a, 103b and the third opening 105 may have similar depths, and may extend from a top surface of the SOI layer 120 down to a predetermined location below the buried dielectric layer 118 and above the base substrate 114. In one embodiment, the first and second openings 103a, 103b and the third opening 105 may have a depth ranging from about 200 nm to about 800 nm, with a depth of 500 nm being more typical. It should be noted that the preferred recess depth of the first and second openings 103a, 103b depends on the thickness of the buried plate 116, the buried dielectric layer 118, and the SOI layer 120. The first and second openings 103a, 103b and the third opening 105 may also be similar in shape, but have different widths. The first and second openings 103a, 103b may have a smaller width than the third opening 105. In one embodiment, the third opening 105 may have a width ranging from about 40 nm to about 120 nm, with a width of 80 nm being most typical. The width of the first and second openings 103a, 103b may be adjusted based on the desired result of future processing techniques as described in greater detail below with reference to FIG. 5 while generally maintaining a width less than the width of the third opening 105. The fourth opening 107 may generally be deeper and wider than either the first and second openings 103a, 103b or the third opening 105. The fourth opening 107 may extend from the top surface of the SOI layer 120 down to a predetermined location within the base substrate 114 below the buried plate 116. The fourth opening 107 may extend into the base substrate 114 to effectively isolate semiconductor devices subsequently formed on opposite sides of the fourth opening 107, or opposite sides of the DT isolation structure 108. In one embodiment, the fourth opening 107 may have a width ranging from about 200 nm to about 300 nm, with a width of 250 nm being most typical.

Figure 3:
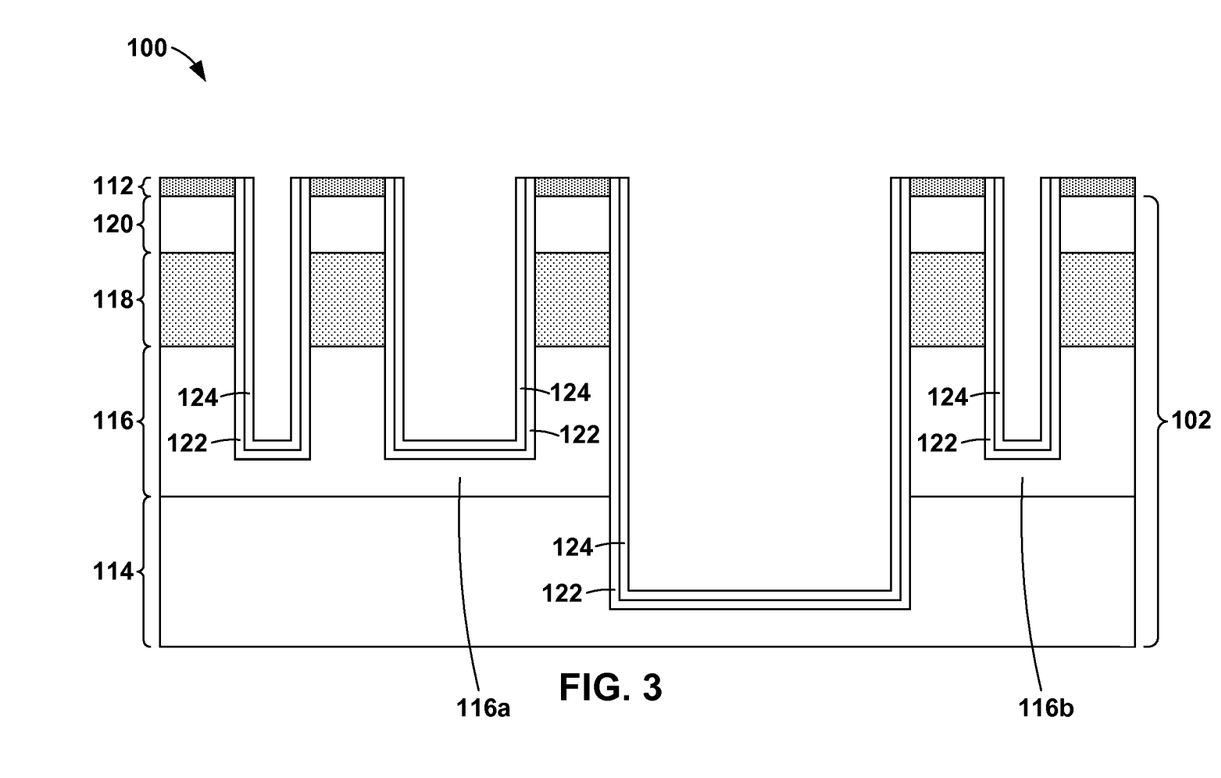
FIG. 3 depicts the deposition of a node dielectric and a metallic liner according to an exemplary embodiment.

Now referring to FIG. 3, a node dielectric 122 and a metallic liner 124, may be conformally deposited within the openings 103a, 103b, 105, 107. The node dielectric 122 and the metallic liner 124 may or may not de required in all the openings, however, the node dielectric 122 and the metallic liner 124 may be deposited in all the openings 103a, 103b, 105, 107 to minimize process steps and maintain current process flows.

The node dielectric 122 may include, for example, oxides, nitrides, oxynitrides and/or high-k materials, and can be formed within the openings by any suitable process such as thermal oxidation, thermal nitridation, atomic layer deposition (ALD), chemical vapor deposition (CVD). In one embodiment, the node dielectric 122 may comprise a high-k material having a dielectric constant greater than the dielectric constant of silicon nitride, which is about 7.5. Exemplary high-k materials may include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x may independently range from about 0.5 to about 3 and each value of y may independently range from 0 to about 2. The node dielectric 122 may have a thickness ranging from about 8 nm to about 12 nm, although a thickness of the node dielectric 122 less than 8 nm or greater than 12 nm may be conceived. Preferably, the node dielectric 122 may have a thickness of about 10 nm.

The metallic liner 124 may then be deposited on the surface of the node dielectric 122. The metallic liner 124 may include any suitable conductive material, including but not limited to, doped polycrystalline or amorphous silicon, germanium, silicon germanium, a metal (e.g., tungsten, titanium, tantalum, ruthenium, zirconium), a conducting metallic compound material (e.g., tantalum nitride, titanium nitride, tungsten silicide, tungsten nitride, titanium nitride, tantalum nitride), carbon nanotube, conductive carbon, or any suitable combination of these materials. The metallic liner 124 can be deposited by any suitable method, including but not limited to, atomic layer deposition (ALD), chemical vapor deposition (CVD), low-pressure chemical vapor deposition (LPCVD), ultrahigh vacuum chemical vapor deposition (UHVCVD), metalorganic chemical vapor deposition (MOCVD), physical vapor deposition, sputtering, plating, evaporation, spin-on-coating, ion beam deposition, electron beam deposition, laser assisted deposition, and chemical solution deposition. In one particular embodiment, the metallic liner 124 may include doped polysilicon deposited by LPCVD. The metallic liner 124 may have a thickness ranging from about 8 nm to about 13 nm, although a thickness of the metallic liner 124 less than 8 nm or greater than 13 nm may be conceived. Preferably, the metallic liner 124 may have a thickness of about 10.5 nm.

Figure 4:
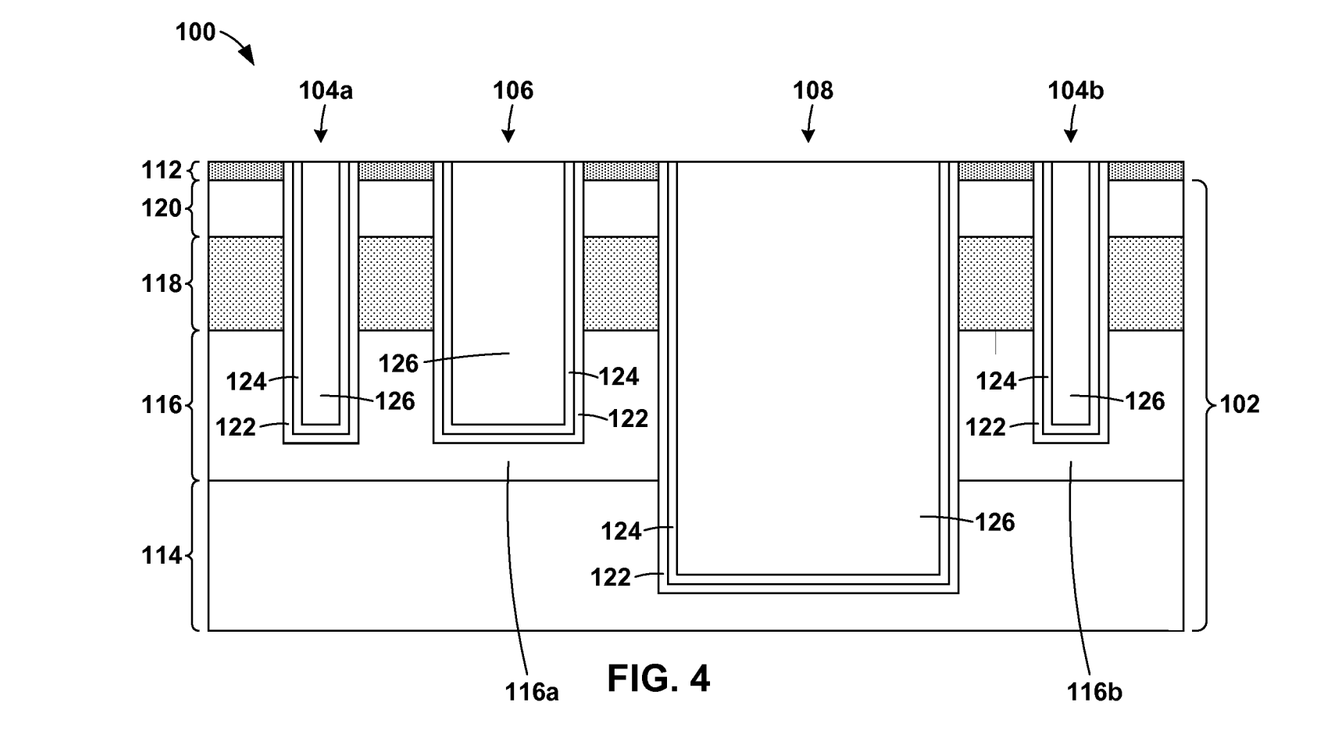
FIG. 4 depicts the deposition of an inner electrode according to an exemplary embodiment.

Referring now to FIG. 4, an inner electrode 126 may be formed by depositing any suitable conductive material on the inner walls of the metallic liner 124. The inner electrode 126 may be a doped semiconductor material or a metal. If the inner electrode 126 is a doped semiconductor material, the doped semiconductor material may include any material listed above for the base substrate 114. The dopants may be a p-type dopant or an n-type dopant. The doped semiconductor material may be deposited by chemical vapor deposition such as low pressure chemical vapor deposition (LPCVD). In one embodiment, the inner electrode 126 may include amorphous silicon deposited by LPCVD If the inner electrode 126 is an elemental metal, exemplary elemental metals may include Ta, Ti, Co, and W. Alternatively, the inner electrode 126 may be a conductive metallic alloy, and exemplary conductive metallic alloys may include a mixture of elemental metals, a conductive metallic nitride such as TiN, ZrN, HfN, VN, NbN, TaN, WN, TiAlN, TaCN, and an alloy thereof. The inner electrode 126 may be formed by known suitable deposition techniques, for example, chemical vapor deposition (CVD), physical vapor deposition (PVD), or atomic layer deposition (ALD). The node dielectric 122 may serve as an insulating barrier to prevent a short circuit between the buried plate 116 and the metallic liner 124 or the inner electrode 126. In one embodiment, the metallic liner 124 may be omitted, and the inner electrode 126 may be deposited directly on top of the node dielectric 122.

In one embodiment, the openings 103a, 103b, 105, 107 (shown in FIG. 2) may each be fabricated individually and each having different fill compositions. The first and second openings 103a, 103b may be substantially filled with any suitable conductive material. The third opening 105 may be filled with a node dielectric, a metallic liner, and an inner electrode as described previously above. The fourth opening 107 may be substantially filled with any known insulative material, for example a dielectric.

With continued reference to FIG. 4, the test structures 104a, 104b, the deep trench capacitor 106, and the DT isolation structure 108 may be depicted at an intermediate step of fabrication. It should be noted that there exists a direct correlation between the size, shape, and depth of the test structures 104a, 104b, the deep trench capacitor 106, and the DT isolation structure 108, and the first and second openings 103a, 103b, the third opening 105, and the fourth opening 107, respectively. Thus, the test structures 104a, 104b may generally be smaller than the deep trench capacitor 106, and the DT isolation structure 108 may generally be larger than both the test structures 104a, 104b and the deep trench capacitor 106.

Figure 5:
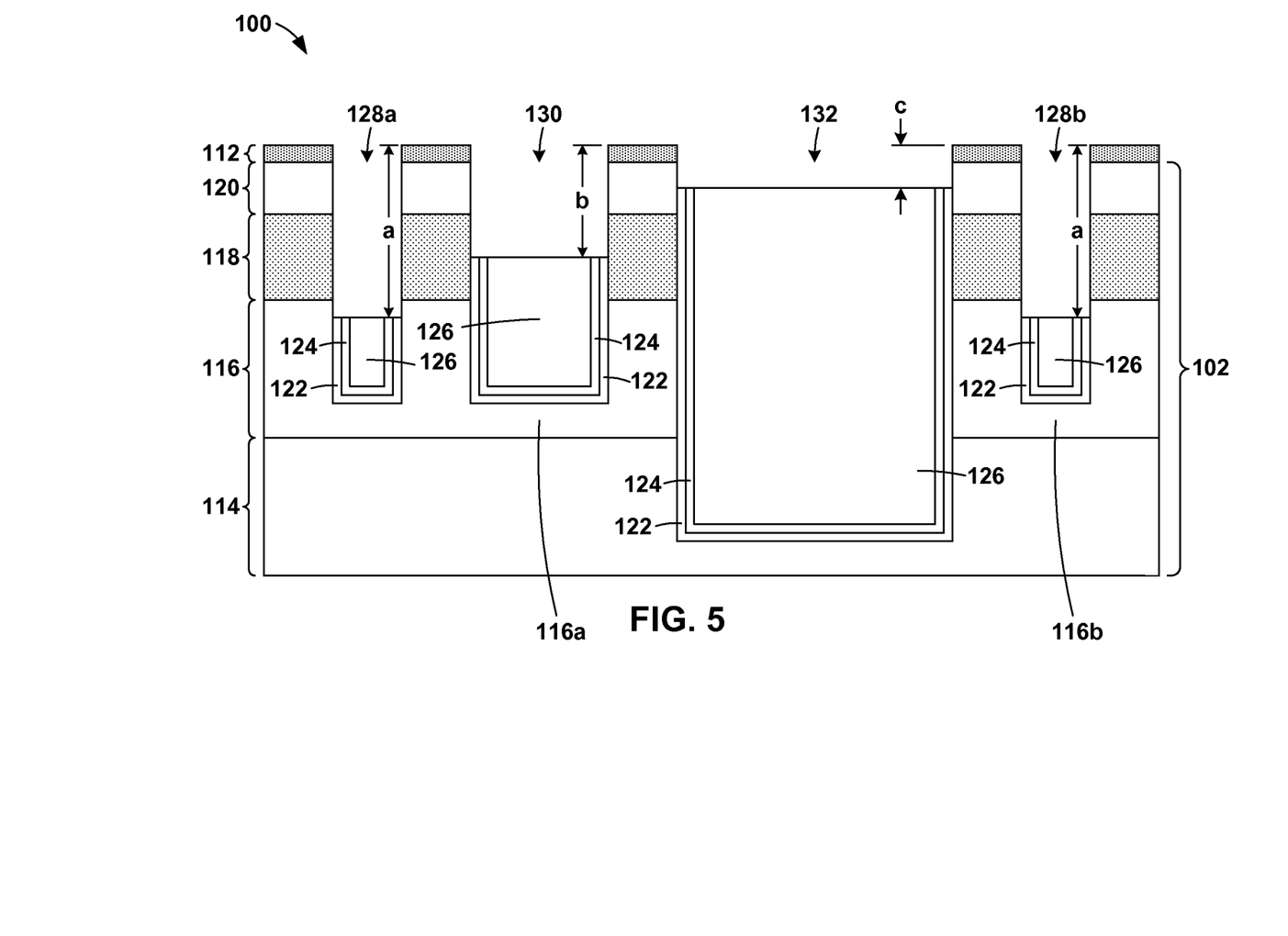
FIG. 5 depicts the removal of a portion of the node dielectric, metallic liner, and the inner electrode according to an exemplary embodiment.

Referring now to FIG. 5, a first recess etching technique ("the first recess etch") may be used to recess the node dielectric 122, the metallic liner 124, and the inner electrode 126. Any suitable chemical etching technique can be used for the first recess etch. In one embodiment, for example, a reactive ion etch (RIE) technique using $C_xFl_y$ chemistries may be used to recess the node dielectric 122, the metallic liner 124, and the inner electrode 126. The first recess etch may be selective to the pad layer 112 and etch or remove only the node dielectric 122, the metallic liner 124, and the inner electrode 126. The first recess etch may result in new openings 128a, 128b, 130, 132. It should be noted there may exists a direct relationship between the openings 103a, 103b, 105, 107 and the openings 128a, 128b, 130, 132, respectively. It should also be noted that, like the first and second openings 103a, 103b, the openings 128a, 128b may be similar in size.

The particular etching technique used for the first recess etch may be calibrated to produce an inverse RIE lag affect, in which there exists a correlation between the feature width and the recess depth. Inverse RIE lag, as is known in the art, produces a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Fluorine) with high oxide-to-nitride selectivity (where the blanket etch rate ratios is greater than approximately 20:1). In another embodiment, conditions characterized by high polymerization, may include general chemistries such as O2 (oxygen), a dilutant, and one more of: C4F6, C5F8, or C4F8. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

In the present embodiment, for example, the openings 128a, 128b may have a larger recess depth than the opening 130, because the openings 128a, 128b may have a smaller width than the opening 130. The openings 128a, 128b may have a recess depth (a) and the opening 130 may have a recess depth (b), and therefore the recess depth (a), of the openings 128*a*, 128*b*, may be larger than the recess depth (b), of the opening 130. Similarly, for example, both the openings 128*a*, 128*b* and the opening 130 may each have a recess depth considerably deeper than the opening 132, because the opening 132 may be considerably larger than both the openings 128*a*, 128*b* and the opening 130. The opening 132 may have a recess depth (c), and therefore the recess depth (a), of the openings 128*a*, 128*b*, and the recess depth (b), of the opening 130, may each be larger than the recess depth (c), of the opening 132. Ultimately, the openings 128*a*, 128*b*, 130, 132 may each have a different recess depth due to their different widths, while noting that the openings 128*a*, 128*b* may be substantially similar.

With continued reference to FIG. 5, as described above, different size features may each have a different recess depth as a result of the first recess etch. As described above, the openings 128*a*, 128*b*, 130, 132 may correspond to the test structures 104*a*, 104*b*, the deep trench capacitor 106, and the DT isolation structure 108, respectively. In one embodiment, the opening 130 may be recessed to a predetermined depth within the buried dialectic layer 118 to ensure electrical isolation between the metallic liner 124, and the inner buried plate 116*a*. The electrical isolation may be achieve by ensuring the node dielectric 122 remains between the metallic liner 124, and the inner buried plate 116*a*. Risk of an electrical short may be present should the opening 130 be recessed to a level below the buried dielectric layer 118. Such electrical isolation may be preferred in order to form the corresponding feature to the opening 130, the deep trench capacitor 106.

In one embodiment, the openings 128*a*, 128*b* may preferably be recessed to a predetermined depth below the buried dialectic layer 118 to expose some portion of the inner and outer buried plates 116*a*, 116*b*. A preferred electrical connection may be made to the exposed portion of the inner and outer buried plates 116*a*, 116*b* as described in greater detail below with reference to FIG. 7. As described above, the preferred recess depth below the buried dielectric layer 118 may be achieved by carefully adjusting the width of the opening.

In one embodiment, similar results may be achieved by applying a known RIE lag technique to a similar structure where the test structures 104*a*, 104*b* may be larger in width than the deep trench capacitor 106. In such an instance and under the known principles of RIE lag, the larger features, for example the test structures 104*a*, 104*b*, may etch faster than the smaller structures, for example, the deep trench capacitor 106. The DT isolation structure 108 may still be considerably larger than either the test structures 104*a*, 104*b* or the deep trench capacitor 106.

Figure 6:
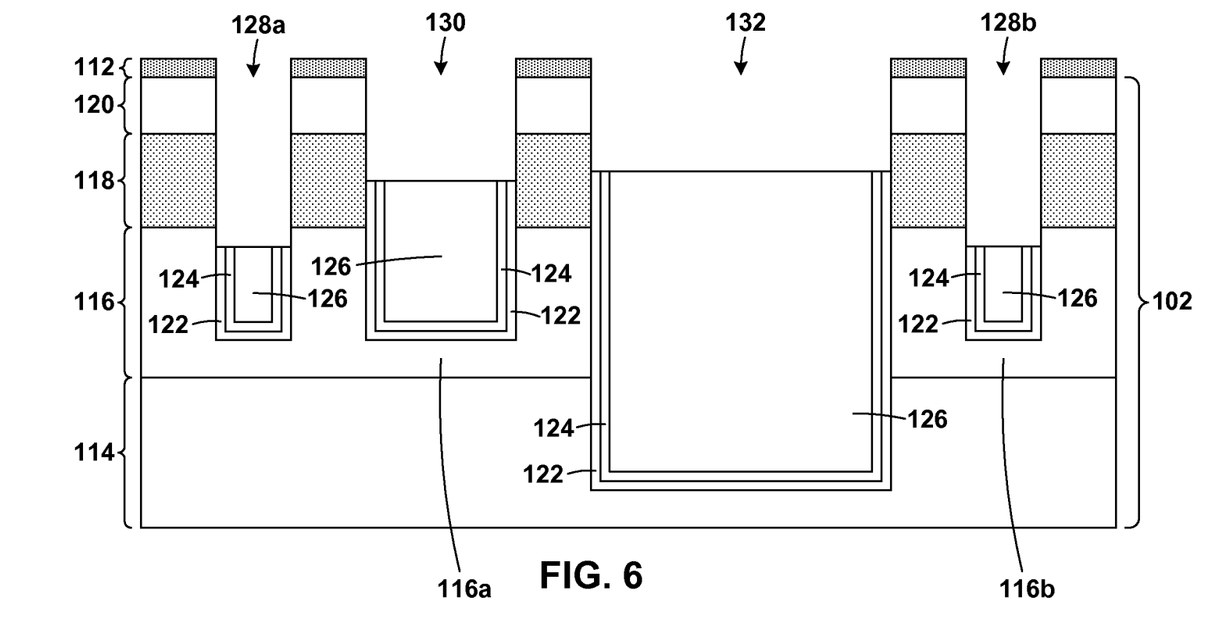
FIG. 6 depicts the removal of another portion of the node dielectric, the metallic liner, and the inner electrode according to an exemplary embodiment.

Referring now to FIG. 6, a second recess etching technique ("the second recess etch") may be used to recess further the node dielectric 122, the metallic liner 124, and the inner electrode 126. Known etching techniques may be used for the second recess etch, for example a RIE technique. The particular etch rate of the technique used may be fine tuned to achieve desired results. For example, the second recess etch may preferably recess the node dielectric 122, the metallic liner 124, and the inner electrode 126 within the opening 132 to a location within the buried dielectric layer 118. Like the first recess etch, the second recess etch may be selective to the pad layer 112 and etch or remove only the node dielectric 122, the metallic liner 124, and the inner electrode 126. Also, the second etch may primarily recess the node dielectric 122, the metallic liner 124, and the inner electrode 126 within the opening 132, while recessing little if any of the node dielectric 122, the metallic liner 124, and the inner electrode 126 within the openings 128*a*, 128*b*, 130. In one embodiment, a RIE technique using a combination of $C_xFl_y$ and Ar chemistries may be used to further recess the node dielectric 122, the metallic liner 124, and the inner electrode 126. Typical known principles of RIE lag may be applied to achieve the desired recess depths.

Figure 7:
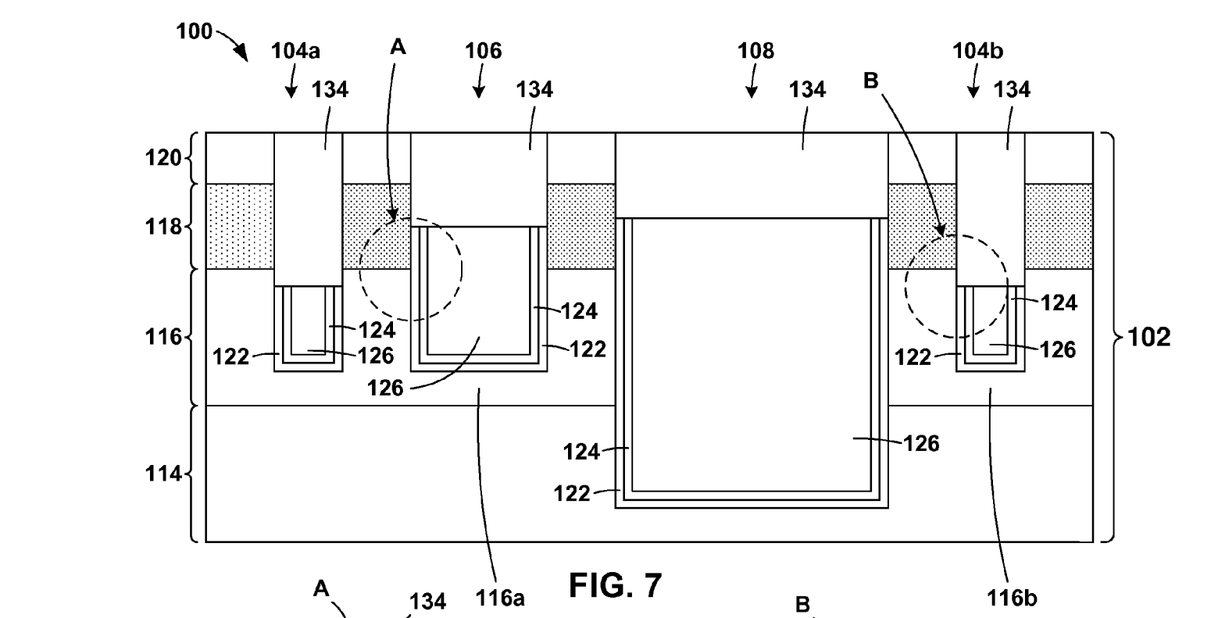
FIG. 7 depicts the deposition of a conductive material according to an exemplary embodiment.
Figure 8:
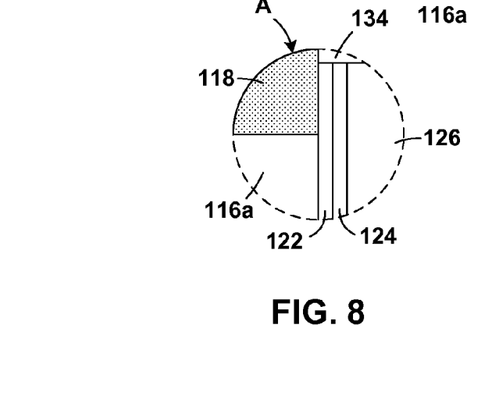
FIG. 8 depicts a section view of FIG. 7 according to an exemplary embodiment.
Figure 9:
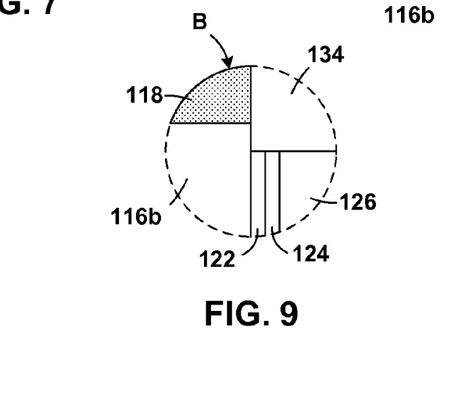
FIG. 9 depicts a section view of FIG. 7 according to an exemplary embodiment.

Referring now to FIG. 7, a conductive fill material 134 may be deposited in, and substantially fill, the openings 128*a*, 128*b*, 130, 132. The conductive fill 134 may include any suitable conductive material, for example, amorphous silicon. It may be an advantage of the present embodiment that electrical contact is made with the inner and outer buried plates 116*a*, 116*b* via the conductive fill 134. The desired electrical connection may be formed within the test structures 104*a*, 104*b* where the conductive material 134 comes in direct contact with the inner and outer buried plates 116*a*, 116*b*. See also FIG. 9. Also, as mentioned above, it may be an advantage of the present embodiment that electrical isolation be maintained between the inner buried plate 116*a*, and the metallic liner 124 of the deep trench capacitor 106. See FIG. 8. This electrical isolation may be provided by the node dielectric 122. The electrical connection to the inner and outer buried plates 116*a*, 116*b*, made at the test structures 104*a*, 104*b*, may be used to measure the voltage of the inner and outer buried plates 116*a*, 116*b* shortly after the formation of the DT isolation structure 108. More specifically, the voltage of the inner buried plate 116*a* may be compared with the voltage of the outer buried plate 116*b* to assess and ensure the functionality and integrity of the DT isolation structure 108. This testing procedure may be described in greater detail below.

With continued reference to FIG. 7, the structure 100 is depicted at an intermediate step of fabrication. At this step, the structure 100 may include, as shown in FIG. 6, the test structures 104*a*, 104*b*, the deep trench capacitor 106, and the DT isolation structure 108. The test structures 104*a*, 104*b* may include the node dialectic 122, the metallic liner 124, and the inner electrode 126 recessed to a level below the buried dielectric layer 118. The deep trench capacitor 106 may include the node dialectic 122, the metallic liner 124, and the inner electrode 126 recessed to a level within the buried dielectric layer 118. The DT isolation structure 108 may include the node dialectic 122, the metallic liner 124, and the inner electrode 126 recessed to a level within the buried dielectric layer 118. The test structures 104*a*, 104*b*, the deep trench capacitor 106, and the DT isolation structure 108 all have the conductive fill 134 which may substantially fill each element. In the case of the test structures 104*a*, 104*b* the conductive fill 134 may be in electrical contact with the buried plates 116*a*, 116*b*, respectively. See also FIG. 9. In the case of the deep trench capacitor 106 and the DT isolation structure 108 the conductive fill 134 may remain electrically isolated from the buried plates 116*a*, 116*b*. See also FIG. 8.

Immediately following the formation of the test structures 104*a*, 104*b*, the deep trench capacitor 106, and the DT isolation structure 108, as depicted in FIG. 7, a VC inspection testing sequence ("the testing sequence") may be used to test the functionality and integrity of the DT isolation structure 108. Typically, a contact level and a metallization level are required to measure the voltage of the inner and outer buried plates 116*a*, 116*b* in order to test the DT isolation structure 108. The time and expense of fabricating these additional levels may be for nothing should the DT isolation structure 108 fail the testing sequence. The testing sequence may be carried out on the structure 100 immediately, or shortly, after the formation of the DT isolation structure 108. The ability to do so may save fabrication time and costs because the additional contact and metallization levels may no longer be needed to measure the voltage of the inner and outer buried plates 116*a*, 116*b*. A voltage measurement of the inner and outer buried plates 116a, 116b may be conducted through the test structures 104a, 104b. As described in detail above, the conductive material 134 of the test structures 104a, 104b may be in direct contact with the inner and outer buried plates 116a, 116b due to the recess depth of the first recess etch, see FIG. 9. Furthermore, it should be noted that the test structure 104a may be located within the DT isolation structure 108 and the test structure 104b may be located outside the DT isolation structure 108 in order to obtain voltage measurements of the inner and outer buried plate 116a, 116b. See FIG. 1.

The testing sequence may include measuring the voltage of the inner buried plate 116a, and measuring the voltage of the outer buried plate 116b. The voltage of the inner buried plate 116a may differ from the voltage of the outer buried plate 116b. In one embodiment, the voltage measurements may differ by about 1-5 volts. In such cases, it may be determined that the DT isolation structure 108 is properly isolating the inner buried plate 116a from the outer buried plate 116b. In one embodiment, the voltage of the inner buried plate 116a may be substantially equal to the voltage of the outer buried plate 116b. In such cases, it may be determined that the DT isolation structure 108 is not properly isolating the inner buried plate 116a from the outer buried plate 116b.

The testing sequence may be conducted using any method for VC inspection testing known in the art. In one embodiment, for example, an inspection scanning electron microscope (SEM) may be used to conduct the VC inspection test. In such instances an electron beam (e-beam) may be used to charge the inner and outer buried plates 116a, 116b, through test structures 104a, 104b, and thereby induce voltages. The electron emission of each of the test sites, for example, the test structures 104a, 104b, is measured to determine the relative voltage between the inner buried plate 116a and the outer buried plate 116b. If the DT isolation structure 108 is functioning properly, the inner buried plate 116a may be smaller in area and therefore have a lower capacitance. Both the inner and outer buried plates 116a, 116b will charge up through the test structures 104a, 104b. The inner plate 116a, will charge up to a higher voltage than the outer buried plate 116b because of the size difference and resulting difference in capacitance between the inner buried plate 116a and the outer buried plate 116b. Therefore, the electron emission may be directly related to how positively charged the particular test structure is. Under positive mode conditions, in which the wafer surface may be positively charged, the greater the positive charge of a particular test site the fewer electrons it may emit. It should be noted that at least one test structure, for example the test structure 104a, may form an electrical contact with the inner buried plate 116a and at least one test structure, for example the test structure 104b, may form and electrical contact with the outer buried plate 116b.

If the electron emission measured from the test structure 104a is the same as the electron emission measured from the test structure 104b, then there may be an indication that the DT isolation structure 108 is shorted, and therefore not properly functioning as an isolation structure. If the electron emission measured from the test structure 104a is different from the electron emission measured from the test structure 104b, then there may be an indication that the DT isolation structure 108 is effectively isolating the inner buried plate 116a from the outer buried plate 116b. Also, the DT isolation structure 108 may be connected to the ground structure 110 (shown in FIG. 1). The ground structure 110 may be connected to a capacitor and function as a virtual ground in order to eliminate current flow between the inner and outer buried plates 116a, 116b. The bottom of the DT isolation structure 108 effectively forms an NFET where the inner and outer buried plates 116a, 116b may act as the source and drain. This simulated transistor structure may be forced off by grounding the DT isolation structure 108. A large capacitor may be used to provide the virtual grounding.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
providing a semiconductor-on-insulator (SOI) substrate having a buried dielectric layer located above a buried plate;
forming a deep trench isolation structure in the SOI substrate having a first node dielectric and a first inner electrode, wherein the deep trench isolation structure electrically isolates an inner buried plate located on one side of the deep trench isolation structure from an outer buried plate located on an opposite side of the deep trench isolation structure;
forming a deep trench capacitor in the SOI substrate having a second node dielectric and a second inner electrode;
forming a first test structure and a second test structure in the SOI substrate and on opposite sides of the deep trench isolation structure, the first and second test structures having a third node dielectric and a third inner electrode, wherein the first test structure and the second test structure are similar in size and shape, and have a different width than the deep trench capacitor;
etching the third node dielectric and the third inner electrode of the first and second test structures to a first depth below the buried dielectric layer;
etching the second node dielectric and the second inner electrode of the deep trench capacitor to a second depth above the buried plate and within the buried dielectric layer; and
etching the first node dielectric and the first inner electrode to a third depth above the buried plate and within the buried dielectric layer, wherein the first depth is deeper than the second depth.

2. The method of claim 1, wherein the first and second test structures have a smaller width than the deep trench capacitor.

3. The method of claim 1, wherein the first and second test structures have a larger width than the deep trench capacitor.

4. The method of claim 1, further comprising:
filling the first and second test structures, the deep trench capacitor, and the deep trench isolation structure with an electrically conductive material, wherein the electrically conductive material associated with the first and second test structures is in electrical contact with the inner buried plate and the outer buried plate, respectively, and wherein the electrically conductive material of the deep trench capacitor and the deep trench isolation structure remains isolated from the buried plate.

5. The method of claim 1, wherein the deep trench isolation structure completely surrounds the inner buried plate and electrically isolates the inner buried plate from the outer buried plate.

* * * * *